(12) United States Patent
Dinh et al.

(10) Patent No.: US 11,222,961 B2
(45) Date of Patent: Jan. 11, 2022

(54) LATERAL SEMICONDUCTOR DEVICE HAVING RAISED SOURCE AND DRAIN, AND METHOD OF MANUFACTURE THEREREOF

(71) Applicant: NXP B.V., Eindhoven (NL)

(72) Inventors: Viet Dinh, Leuven (NL); Guido Sasse, 's-Hertogenbosch (NL); Paul Grudowski, Austin, TX (US)

(73) Assignee: NXP B.V., San Jose, CA (US)

( * ) Notice: Subject to any disclaimer, the term of this patent is extended or adjusted under 35 U.S.C. 154(b) by 7 days.

(21) Appl. No.: 16/848,195

(22) Filed: Apr. 14, 2020

(65) Prior Publication Data

US 2020/0343368 A1 Oct. 29, 2020

(30) Foreign Application Priority Data

Apr. 24, 2019 (EP) ...................... 19170824

(51) Int. Cl.
*H01L 29/772* (2006.01)
*H01L 21/8238* (2006.01)
(Continued)

(52) U.S. Cl.
CPC .......... *H01L 29/66681* (2013.01); *H01L 21/823814* (2013.01); *H01L 29/6656* (2013.01); *H01L 29/6659* (2013.01)

(58) Field of Classification Search
CPC ......... H01L 21/66681–66689; H01L 29/7801; H01L 29/7816–7817;
(Continued)

(56) References Cited

U.S. PATENT DOCUMENTS 7,824,968 B2 * 11/2010 Chu ................... H01L 29/7835
438/135
7,923,315 B2 * 4/2011 Pouydebasque ..........................
H01L 29/66636
438/157

(Continued)

OTHER PUBLICATIONS

Appels et al.: "High voltage thin layer devices (RESURF devices)", 1979 International Electron Devices Meeting, Dec. 3-5, 1979, Washington, DC, USA, pp. 1-7.

(Continued)

*Primary Examiner* — Maliheh Malek

(57) ABSTRACT

A semiconductor device is disclosed, a substrate structure; a raised source region; a raised drain region; a separation region disposed laterally between the raised source region and the raised drain region; a gate structure, disposed between the raised source region and the raised drain region and above a part of the separation region, the gate structure being spaced apart from the drain region and defining a drain extension region therebetween; a dummy gate structure in the drain extension region; an epitaxial layer, disposed above and in contact with the substrate structure and forming the raised source region, the raised drain region, and a raised region between the gate structure and the dummy gate structure, wherein the raised region between the gate structure and the dummy gate structure is relatively lightly doped to a conductivity of a second conductivity type which is opposite the first conductivity type.

15 Claims, 7 Drawing Sheets

(51) Int. Cl.
*H01L 29/66* (2006.01)
*H01L 29/78* (2006.01)

(58) Field of Classification Search
CPC ... H01L 29/0852–0886; H01L 29/1095; H01L 21/823814
See application file for complete search history.

(56) References Cited

U.S. PATENT DOCUMENTS

| | | | | |
|---|---|---|---|---|
| 9,082,852 | B1* | 7/2015 | Liu | H01L 29/785 |
| 9,306,060 | B1* | 4/2016 | Yang | H01L 29/1095 |
| 9,853,021 | B1* | 12/2017 | Wang | H01L 29/66545 |
| 10,008,573 | B1* | 6/2018 | Hsiao | H01L 29/402 |
| 10,043,894 | B2* | 8/2018 | Dinh | H01L 29/0607 |
| 10,573,743 | B2* | 2/2020 | Shinohara | H01L 29/42368 |
| 2005/0156234 | A1* | 7/2005 | Gammel | H01L 29/41 257/335 |
| 2011/0241113 | A1* | 10/2011 | Zuniga | H01L 29/7816 257/343 |
| 2013/0181285 | A1* | 7/2013 | Ng | H01L 29/0696 257/335 |
| 2014/0183628 | A1* | 7/2014 | Ito | H01L 29/0882 257/335 |
| 2015/0076610 | A1 | 3/2015 | Ito | |
| 2016/0104774 | A1* | 4/2016 | Ciavatti | H01L 29/0882 257/329 |
| 2016/0141420 | A1* | 5/2016 | Chen | H01L 29/0653 257/343 |
| 2016/0181358 | A1 | 6/2016 | Zhang et al. | |
| 2016/0225895 | A1* | 8/2016 | He | H01L 29/785 |
| 2017/0018551 | A1* | 1/2017 | Ponoth | H01L 29/7816 |
| 2017/0018618 | A1 | 1/2017 | Ito et al. | |
| 2017/0243977 | A1* | 8/2017 | Lin | H01L 29/0653 |
| 2017/0338343 | A1* | 11/2017 | Baudot | H01L 21/76 |
| 2018/0012992 | A1* | 1/2018 | Lee | H01L 29/0619 |
| 2018/0261676 | A1* | 9/2018 | Sonsky | H01L 29/42368 |
| 2018/0286858 | A1* | 10/2018 | Liu | H01L 29/0649 |
| 2019/0326300 | A1* | 10/2019 | Liaw | H01L 29/41791 |
| 2020/0006386 | A1* | 1/2020 | Singh | H01L 29/78618 |
| 2020/0035695 | A1* | 1/2020 | Shu | H01L 29/66689 |

OTHER PUBLICATIONS

Benoist et al.: "Improved ESD Protection in Advanced FDSOI by Using Hybrid SOI/Bulk Co-integration", Electrical Overstress/Electrostatic Discharge Symposium Proceedings 2010, Oct. 3-8, 2010, Reno, NV, USA, pp. 1-6.

Dinh et al.: "An SiGe heterojunction bipolar transistor with very high open-base breakdown voltage", 2014 IEEE Bipolar/BICMOS Circuits and Technology Meeting (BCTM), Sep. 28-Oct. 1, 2014, Coronado, CA, USA, pp. 33-36.

Dinh et al.: "Novel 5V-EDMOS transistor with a record fMAX of 450 GHz in a baseline 40nm CMOS technology", 2017 IEEE International Electron Devices Meeting (IEDM), San Francisco, CA, USA, Dec. 2-6, 2017, pp. 1-4.

Litty et al.: "Optimization of a high-voltage MOSFET in ultra-thin 14nm FDSOI technology", 2015 IEEE 27th International Symposium on Power Semiconductor Devices & IC's (ISPSD), May 10-14, 2015, Hong Kong, China, pp. 73-76.

Toh et al.: "A 300mm Foundry HRSOI Technology with Variable Silicon Thickness for Integrated FEM Applications", 2016 IEEE International Electron Devices Meeting (IEDM), Dec. 3-7, 2016, San Francisco, CA, USA, pp. 2.4.1-2.4.4.

* cited by examiner

510  FIG. 5a 110  105

LATERAL SEMICONDUCTOR DEVICE HAVING RAISED SOURCE AND DRAIN, AND METHOD OF MANUFACTURE THEREROF

CROSS-REFERENCE TO RELATED APPLICATIONS

This application claims the priority under 35 U.S.C. § 119 of European Patent application no. 19170824.7, filed on 24 Apr. 2019, the contents of which are incorporated by reference herein.

FIELD

The present disclosure relates to semiconductor devices having laterally spaced apart, raised source and drain regions.

BACKGROUND

In modern silicon-based (or silicon-germanium, or other group-4) based semiconductor processing technologies, in particular those for lateral devices and at advanced manufacturing nodes, which for present purposes may be considered those for which the gate length or minimum feature size is less than 28 nm, it has been found that forming the source and drain regions of the device using an epitaxial layer may be beneficial to improve the channel mobility and reduce source-drain resistance. However, for high voltage devices such as lateral drift MOS (LDMOS) devices such a raised source drain region can create a very high electric field between the drain-side edge of the gate and the drain extension region, which may cause high gate-drain leakage currents and a potential risk of gate oxide breakdown.

SUMMARY

According to a first aspect of the present disclosure, there is provided a semiconductor device comprising: a substrate structure; a raised source region disposed above or on the substrate structure and comprising a relatively heavily doped layer of a first conductivity type over a relatively lightly doped layer of the first conductivity type, the relatively lightly doped layer extending into the substrate structure; a raised drain region disposed above the substrate structure and spaced apart from the raised source region and comprising a relatively heavily doped layer of the first conductivity type, over a relatively lightly doped layer of the first conductivity type, the relatively lightly doped layer extending its the substrate structure; a separation region disposed laterally between the raised source region and the raised drain region; a gate structure, disposed between the raised source region and the raised drain region and above a part of the separation region, the gate structure being spaced apart from the drain region and defining a drain extension region therebetween; a dummy gate structure in the drain extension region and spaced apart from the gate structure; an epitaxial layer, disposed above and in contact with the substrate structure and forming the raised source region, the raised drain region, and a raised region between the gate structure and the dummy gate structure, wherein the raised region between the gate structure and the dummy gate structure is relatively lightly doped to a conductivity of a second conductivity type which is opposite the first conductivity type. The relatively light doping level of the raised region between the gate structure and the dummy gate structure may be doped at the same level as but the opposite type to the relatively lightly doped layer of each of the source and drain. The raised source region and raised drain region may be in contact with the substrate structure.

In one of more embodiments, the device is an NMOS device wherein the first conductivity type is n-type and the second conductivity type is p-type. Alternatively, in other embodiments the device is a PMOS device wherein the first conductivity type is p-type and the second conductivity type is n-type.

In one or more embodiments, a region of the substrate structure which extends from under the raised drain region to under a part of the gate structure is doped with the first conductivity type, to a level which is lower than the relatively lightly doped level, and a region of the substrate structure which extends from under the remainder of the gate structure to under the raised source region is doped with the second conductivity type, to a level which is lower than the lightly doped level. Such regions are typically referred to as an n-well and a p-well, or a p-well and an n-well.

In one or more embodiments, the doping of the lightly doped raised region between the gate structure and the dummy gate structure extends beneath the epitaxial layer into the substrate structure, and extends laterally under a part of at least one of the gate structure and the dummy gate structure. This doping may typically be provided by an implant, which may be an angled implant. In one or more other embodiments, the doping may be provided by including a dopant precursor into the epitaxial growth environment to result in "in-situ" doping of the epitaxial layer as it is grown. The skilled person will appreciate that in such as-grown doping embodiments, separate masking and epitaxial growth steps will be required for each of: (a) the raised source and drain region, and (b) the epitaxial growth in the exposed extended drain region: providing a dopant by means of later implants may thus involve fewer process steps.

According to a second aspect of the present disclosure, there is provided an integrated circuit comprising at least one semiconductor device above being a NMOS device and wherein the first conductivity type is n-type and the second conductivity type is p-type and at least one semiconductor device being a PMOS device and wherein the first conductivity type is p-type and the second conductivity type is n-type. The PMOS device may or may not be as described above.

In one or more embodiments, a doping level of the raised region between the gate structure and the dummy gate structure of the NMOS device is the same as that of the relatively lightly doped drain region of the PMOS device.

In one or more embodiments, each gate and dummy gate structure comprises a gate of a conductive material having a first side face facing the raised drain region and a second side face facing the raised source region, a dielectric layer between and in contact with both the polysilicon gate and the substrate structure, and a respective dielectric spacer layer in contact with the first face and the second face, and wherein the spacer layer in contact with the second face fills the lateral gap between the gate and the raised source region. The first side and second side face correspond to vertical edges of the gate structure when viewed in cross-section, the first being proximal to the drain extension and the second being distal from it. The dielectric layers may be a single layer of oxide, or nitride; in other embodiments one or more the layers may be a composite layer consisting of two or more films or sublayers. The films or sublayers typically consists of oxide or nitride. In one or more embodiments, the gate is polysilicon, in other embodiments it comprises material other than polysilicon. For example, the gate may comprise a combination of polysilicon and metal, such as titanium/titanium nitride or similar material combinations.

In one or more embodiments, the dummy gate structure in the drain extension region is spaced apart from the gate structure by between 100 and 250 nm. In other embodiments, as nonlimiting examples, the dummy gate structure in the drain extension region may be spaced apart from the gate structure by 60 nm to 100 nm. The minimum separation between the gate structure and the dummy gate structure may be determined by the process technology used. A large separation may be undesirable, as increasing the separation between the dummy gate and the gate, reduces the effect of the dummy gate on reducing a high E fields at the vicinity of gate-drain edge. Further, the larger the separation, the larger area of lightly doped material will be in the electrons' flow path, resulting in increased resistance (Ron).

In one or more embodiments, wherein each of the region of the substrate structure which extends from under the raised drain region to under a part of the gate, and the region of the substrate structure which extends from under the remainder of the gate structure to under the raised source region, is doped with the second conductivity type, and the doping level is in a range of $10^{16}$-$5 \times 10^{17}$ cm$^{-3}$.

In one or more embodiments, the doping level of the raised region between the gate structure and the dummy gate structure is in a range of $10^{17}$-$10^{18}$ cm$^{-3}$.

In one or more embodiments, the substrate structure comprises a substrate material, a buried oxide layer over the substrate material, and an epitaxial layer over the buried oxide layer. In other alternative embodiments, the substrate structure consists of a bulk silicon substrate.

According to a further aspect of the present disclosure, there is provided a method of manufacturing a semiconductor device having a raised source region and a raised drain region and a separation therebetween, the method comprising: defining a gate structure, disposed between the raised source region and the raised drain region and above a part of the separation region, the gate structure being spaced apart from the drain region and defining a drain extension region therebetween; defining a dummy gate structure in the drain extension region and spaced apart from the gate structure, at the same time and in the same process steps as defining the gate structure; growing an epitaxial layer, disposed above and in contact with the substrate structure and forming the raised source region, the raised drain region, and a raised region between the gate structure and the dummy gate structure; implanting, a doping material into the raised drain region and into the raised source region to provide a relatively heavily doped layer of a first conductivity type; implanting, by means of an angled implant, a doping material into the raised drain region and into the raised source region to provide a relatively lightly doped layer of the first conductivity type; and implanting by means of an angled implant, a doping material into the raised region between the gate structure and the dummy gate structure to provide a relatively lightly doped layer of a second conductivity type which is opposite to the first conductivity type.

In one or more embodiments, the semiconductor device is an LDNMOS device, wherein the method further comprises manufacturing an LDPMOS device concurrently with the LDNMOS device, and wherein the step of implanting a doping material into the raised region between the gate structure and the dummy gate structure of the LDNMOS device is concurrent with implanting a doping material into the raised region between the gate structure and the dummy gate structure of the LDPMOS device, and the step of implanting a doping material into the raised region between the gate structure and the dummy gate structure of the LDNMOS device is concurrent with implanting a doping material into the raised region between the gate structure and the dummy gate structure of the LDPMOS device.

The current disclosure extends to an MOS semiconductor device comprising a sub-structure: a raised source region of epitaxial silicon on the sub-structure; a raised drain region of epitaxial silicon on the sub-structure; a gate structure disposed on the sub-structure and laterally between the raised source region and the raised drain region, and defining a drain extension region in the sub-structure between the gate structure and the raised drain region; one dummy gate structure disposed on the sub-structure and laterally between the gate structure and the raised drain region; and a region of doped epitaxial silicon on the substructure and between the gate and the dummy gate.

The MOS semiconductor device may further comprise a second dummy gate structure disposed on the sub-structure and laterally between the dummy gate structure and the raised drain region, and a further region of doped epitaxial silicon on the substructure and between the dummy gate and the second dummy gate.

The doping of the region of doped epitaxial silicon may be equal and opposite to that of the raised drain region and that of the raised source region.

The doping concentration profile of the doping in the epitaxial silicon vertically through the region may corresponds to an activated doping implant. In other embodiments, the doping concentration profile in the epitaxial silicon profile vertically through the region is uniform corresponding to in situ doping during epitaxial growth.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which

FIGS. 5*a* to 5*f* illustrate, schematically, manufacturing steps in the manufacture of an LDMOS device as shown in FIG. 4;

Figure 1:
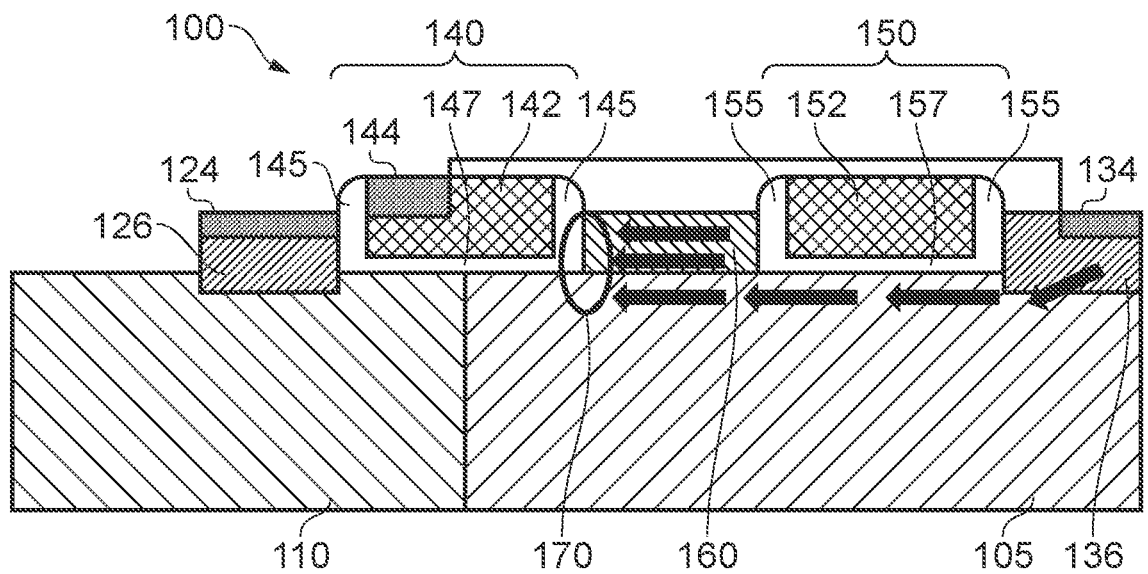
FIG. 1 illustrates an example of a LDMOS device having a raised source drain region.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

High frequency LDMOS devices, sometimes referred to as RF-LDMOS, are commonly used in applications such as power amplifiers for RF front-end modules. For high-power devices, it is known to provide a so-called drain extension, or drift, region between the drain region and the gate, in order to accommodate high voltages in the drain.

Furthermore, for high performance devices, source-drain resistance becomes of increasing concern. To mitigate this problem, and in particular to reduce the source-drain resistance, one approach which has been used, particularly in advanced technologies such as those with effective gate lengths of less than 28 nm, is that of providing a raised source-drain epitaxial growth, also sometimes referred to in the industry as "raised S/D". This is known for both bulk technologies (in which the substrate is silicon) and for so-called SOI technologies (Silicon-On-Insulator), in which a buried oxide layer electronically separates the substrate material from the active device layers.

FIG. 1 illustrates an example of a LDMOS device 100 having a raised source-drain. LDMOS device 100 includes an n-well region 105 and a p-well region 110, which are typically part of a substrate structure, which may be a bulk silicon substrate. Alternatively (not shown) the substrate structure may comprise SOI.

A raised source region is disposed on the substrate, over a part of the p-well region. The raised source region comprises a metallic contact area (not shown), and a relatively heavily doped n-type layer 124 over a relatively lightly doped n-type layer 126. As will be discussed in more detail below, due to the angled-implant doping of the source region, by a so-called "LDD" implant, the relatively lightly doped layer 126 extends into the substrate structure.

A raised drain region is also disposed on the substrate, over a part of the n-well 105 region. The raised source region comprises a metallic contact area (not shown), and a relatively heavily doped n-type layer 134 over a relatively lightly doped n-type layer 136. Again, as will be discussed in more detail below, in embodiments where the doping is providing by an angled-implant doping of the source region, (the so-called "LDD" implant), the relatively lightly doped layer 136 extends into the substrate structure. In some process flows and embodiments, this doping of the source region may be by means of an angled-implant. In other embodiments it may be by a non-angled implant. In still others it may be by means of a doped epitaxial growth.

A gate structure 140 is provided over the interface between the n-well region and the p-well region. The gate structure includes a—typically polysilicon—gate 142 with a gate contact area 144, along with dielectric material or insulating layers forming spacers 145 and dielectric material forming the gate oxide 147. The gate contact area may, as non-limiting examples, be metallic, or be a silicide material such as CoSi, NiSi, TiSi or the like. One or more dummy gate structures 150 may be provided, spaced apart laterally from the gate structure and between the gate structure and the drain region. The dummy gate structure includes a—typically polysilicon—gate 152, along with dielectric material or insulating layers provided as dummy spacers 155 and dummy gate oxide 157. The dummy gate 150 is typically manufactured in the same process steps as the gate 140. Except that the oxide thickness of dummy gate 157 may be different from—typically much thicker than—that of main gate 147. The dummy gate may, or may not, have contact region (none is shown in FIG. 1). Thus, the dummy gate may be left floating, or may be connected to a potential—which would depend on the specific application, but may include a ground, the gate voltage, or a proportion of or opposite sign to the gate voltage.

In common manufacturing process flows, the raised source region and raised drain region are formed by an epitaxial growth process, which occurs after the gate structure and the dummy gate structure have been defined. Epitaxial growth occurs only on the exposed silicon material: silicon is not deposited thereby on the gate structure or the dummy gate structure, typically due to a dielectric hard-mask that is previously deposited on top of the gates (not shown in the Figures), to prevent growth on the polysilicon tops of the gate and dummy gates.", but an epitaxial layer region 160 is formed on the silicon n-well material in the gap between the gate and dummy gate. The epitaxially grown silicon may be intrinsic or undoped; alternatively, in some advanced technologies, the epi layer may be grown with its own doping. In the completed device, this epitaxial layer has a light n-type doping, as a result of diffusion of dopant atoms from the n-well during the LDD implant process.

During operation of the device, current can flow from the drain to the source, along a so-called separation or channel region. Generally, the current flows between the source and drain, through the n-well and p-well layers of the substrate. However, current can also flow into and along the epitaxial layer region 160, as shown by the uppermost two bold arrows in FIG. 1. This results in a high electric field (E-field) in the dielectric material forming the spacers 145 and gate oxide 147, in particular near to the "edge" (as the feature appears when view in cross-section of FIG. 1), or "side face" (as the feature is in three dimensions) of the gate facing, or proximal to, the drain, indicated at 170 in FIG. 1. The consequence of the high E-field may be a high gate-drain leakage, and an early gate oxide break-down of the device in operation.

A common feature in conventional MOS devices is the so-called lightly doped drain (LDD) feature. An LDD feature is created by an implant, which as mentioned above is typically angled, followed—optionally—by thermal activation of the implanted dopant. This LDD anneal may be anneal implant-induced damage and prevent TED (Transient Enhanced Diffusion). In other process flows or embodiments, thermal activation occurs by means of the primary dopant activation anneal which is the final S/D anneal that activates all of the prior implants.

In the case of an angled implant, this is typically carried out at an angle from the normal to the surface of the wafer of between 5° and 10°, or between 6° and 8°, and commonly at 7°. Alternatively, in the case of a non-angled implant, the implant is normal to the surface. It has been found that providing a doping in the drain and source regions of the device can improve device performance, for example by reducing parasitic contact and series resistance. The LDD is applied to the source and drain of the device, prior to the higher level, but shallower, doping of the relatively highly doped drain region 134 and the source region 124. The LDD regions in FIG. 1 are shown at 136 (for the drain), and 126 (for the source).

Figure 2:
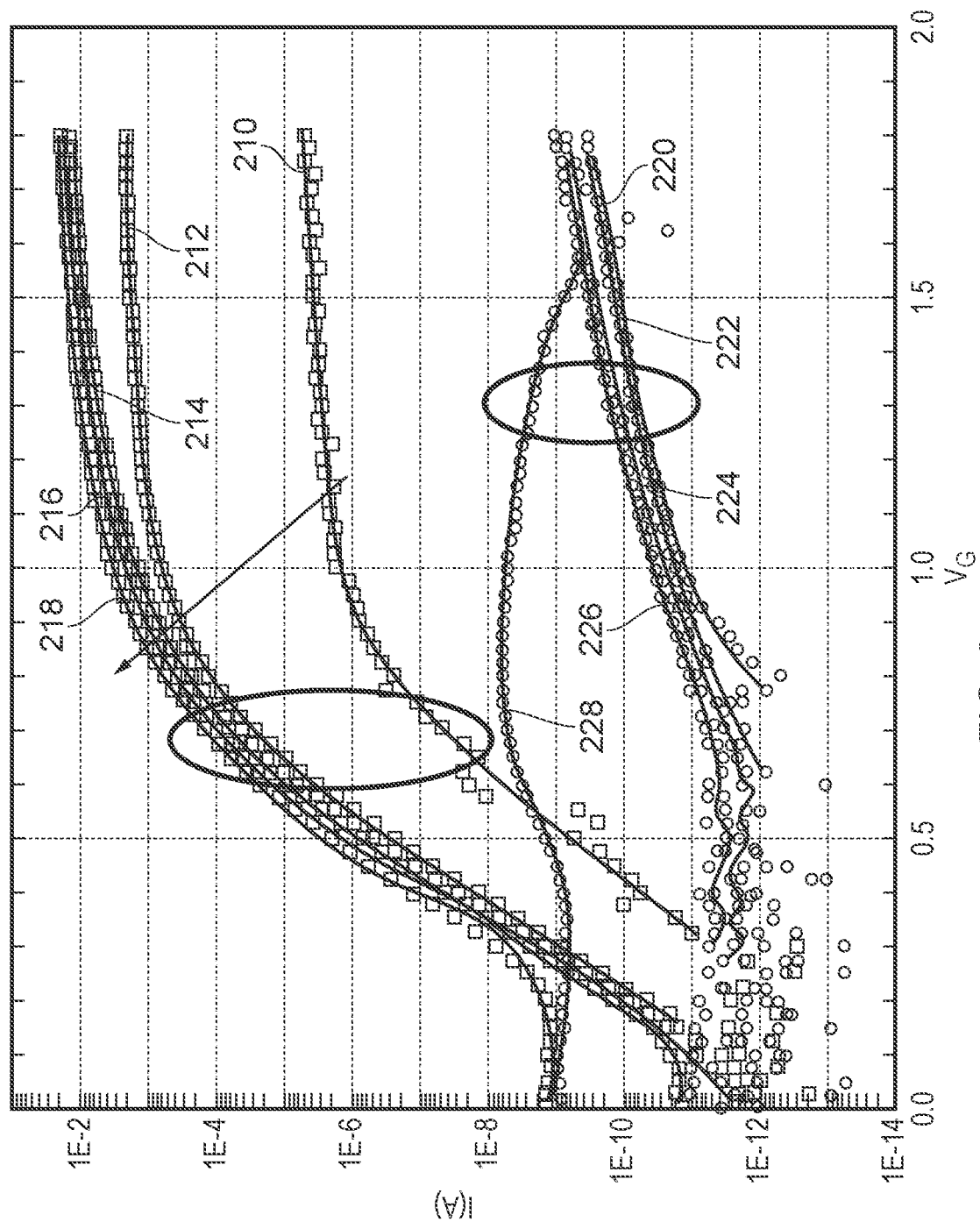
FIG. 2 shows the effect of varying drain voltage on measurements of drain and gate current versus gate voltage.

FIG. 2 illustrates the drain current $I_D$ and gate current $I_G$, on the ordinate or y-axis, plotted against gate voltage $V_G$, on the abscissa or x-axis, and the variation in these parameter as the drain voltage $V_D$ is varied from 0 to 5 V, for a typical device. The drain current is plotted at 210, 212, 214, 216 and 218 for respective drain-source voltages of 0, 0.1, 1.25, 2.5 and 5 V. The gate current is correspondingly plotted at 220, 222, 224, 226, and 228 for the same respective drain-source voltages of 0, 0.1, 1.25, 2.5 and 5 V. It is apparent, by inspection of the gate current $I_G$ 228 at a drain $V_D$ voltage of 5 V, that the gate current has increased by more than two orders of magnitude (from around 2 to $5\times10^{-11}$ to $5\times10^{-9}$ A) at a gate voltage $V_G$ of 1 V. The observed increase in $I_G$ (especially as seen in curve 228) is due to the combined effect of high electric field in the dielectric and the aggravating effect of hot carriers.

The problem of high E-field can be exacerbated by the generation of so-called "hot carriers" when current is flowing through the epitaxial region 160. The skilled person will appreciate that hot carriers may damage the gate dielectric and can aggravate both effects of increased gate-drain currents and reduced robustness against gate dielectric breakdown.

Figure 3:
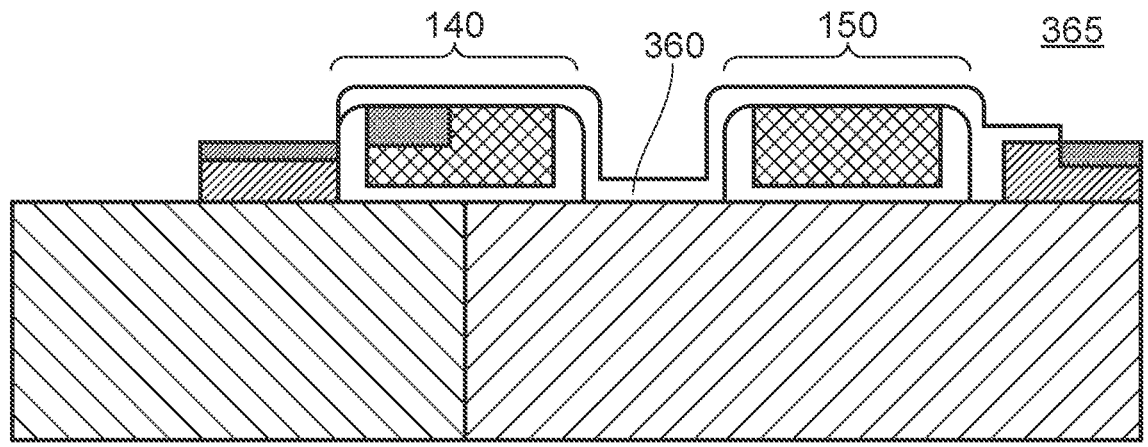
FIG. 3 illustrates a further example of an LDMOS device in which the raised source drain region is excluded from the drain extension.

One solution to this problem is illustrated in FIG. 3. In this example LDMOS device the raised source-drain region is excluded from the drain extension. That is to say, the drain extension, between the gate structure 140 and the dummy gate structure 150, is masked during the process step of growth of the S/D epitaxial layer. To withstand the high temperatures of the epi growth, the masking is carried out by a hard mask, such as dielectric layer or stack, as shown at 360 in FIG. 3. As shown, there may be a gap between the dummy mask and the drain region, in which case this area is also masked to prevent S/D epitaxy. The mask may be, as shown, a hard mask 360 being a dielectric layer or stack.

The provision of the patterned mask, either as a soft mask or a hard mask, results in additional process steps, which adds to the cost of the overall process. This may be undesirable. For some process flows, it may be possible to utilise the same mask as that used to generate to the spacer layers of the gate structure; however, this results in a modified or changed process flow which also results in additional costs and may have implications for other devices on the processed wafer.

The skilled person will appreciate that the description of the examples discussed above, and the embodiments following, generally focus on an n-well under the drain and drain extension, n-doped drain and source regions, and a p-well extending from the gate to beyond the source region, thereby defining an LDNMOS device. The skilled person will equally appreciate that other examples and other embodiments apply equally in which the p-well extends from underneath the drain, beyond the drain extension and to the gate, the n-well extends from the gate to beyond the source region, and the source and drain regions are doped p-type, thereby defining an LDPMOS device.

According to the present disclosure, a process step—which already exists in standard process flows—may be used to reduce or overcome the problems of decreased robustness and increased gate leakage due to one or both of high fields in the dielectric and hot carriers.

Figure 4:
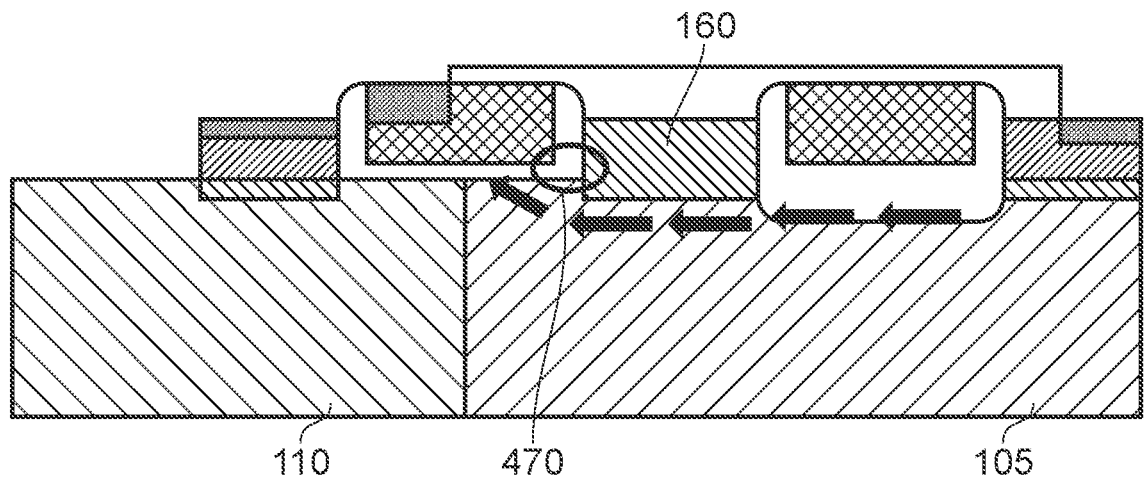
FIG. 4 illustrates an LDMOS device according to one or more embodiments of the present disclosure.

FIG. 4 illustrates an LDMOS device according to one or more embodiments of the present disclosure. This device is structurally similar to the device shown in FIG. 1, with the exception that the epitaxial region 160 between the gate and dummy gate is intentionally doped, either through a separate implant which may be an angled implant, or through growing a doped epi layer. The doping level is higher than that in the n-well region 105. The doping also extends a short distance below the epitaxy layer, into the n-well itself. The doping in this region is provided by utilising the LDD process steps in a typical process flow. However, it should be noted that the dopant type in this area is opposite to that used for the LDD at the drain and source. That is to say, for an LDNMOS device in which the drain and source LDD doping is n-type, the LDD doping used in the drain extension between the gate and dummy gate is p-type. Conversely, for an LDPMOS device in which the drain and source LDD doping is p-type, the LDD doping used in the drain extension between the gate and dummy gate is n-type When used in integrated circuits which include both n-type and p-type LDMOS devices, the LDD implant step used for the (p-type) source and drain LDD doping of the LDPMOS devices is also used to provide the p-type LDD doping in the drain extension region. Conversely, the LDD implant step used for the (n-type) source and drain LDD doping of the LDNMOS devices is also used to provide the n-type LDD doping in the drain extension region.

It should be noted that even if the devices on an integrated circuit are either all LDPMOS or are all LDNMOS, the wafer-scale process flow will generally include both a p-type LDD implant and an n-type LDD implant for other integrated circuits on the same wafer.

Moreover, although the drain extension LDD doping implant is a patterned implant—in that the regions where the implant is not required are masked—the standard LDD doping implant is already patterned to provide implant only at the source and drain regions, so the same patterning mask can be used to define the PLDD doping regions in the drain extension of an LDNMOS device as used for the source and drain LDD doping regions in the LDPMOS device. Conversely, the same patterning mask can be used to define the NLDD doping regions in the drain extension of an LDPMOS device as used for the source and drain LDD doping regions in the LDNMOS.

As a result, this feature does not require any additional or new process steps, so it does not add any manufacturing steps or add to the cost of manufacture.

An effect of the LDD doping having the opposite type, and being at a higher level than the n-well of the drain extension region (in the case of a LDNMOS device), or p-well of the drain extension region (in the case of a LDPMOS device), is that the current flow is pushed down and away from the gate edge, as can be seen schematically at 470 in FIG. 4 and will be discussed in more detail hereinbelow. The consequence may be to significantly reduce gate-drain leakage, and to increase the robustness of the device against oxide breakdown. Device simulations have confirmed a significant reduction in the gate-drain leakage.

Although FIG. 4 shows a single dummy gate structure, the present disclosure extends to devices having a plurality of dummy gate structures, being a dummy gate structure and one or more further dummy gate structures.

FIGS. 5a to 5f illustrate, schematically, manufacturing steps in the manufacture of an LDMOS device as shown in FIG. 4. In order not to obfuscate the details of the present disclosure, only selected process steps in the manufacture of a LDMOS device will be described.

At FIG. 5a is shown part of a substrate structure of an LDMOS device. The substrate structure 510 may be part of a bulk silicon wafer, or may be a composite structure, for instance that used in a fully depleted silicon on insulator device (FDSOI), in which case it may comprise an epitaxial layer above a buried oxide layer, which is on top of a bulk semiconductor substrate—typically silicon, although for very advanced process technologies alternative materials, such as silicon germanium (SiGe), may be used.

Figure 5B:
Figure 5B:
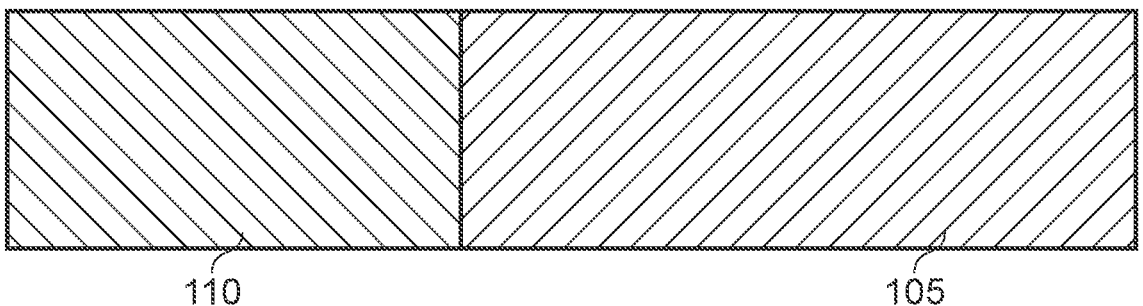

At FIG. 5b is shown the same part of substrate structure after patterned implants have been applied of n-type dopant in the region 105, and p-type dopant in the region 110. These form the n-well and p-well respectively.

Figure 5C:
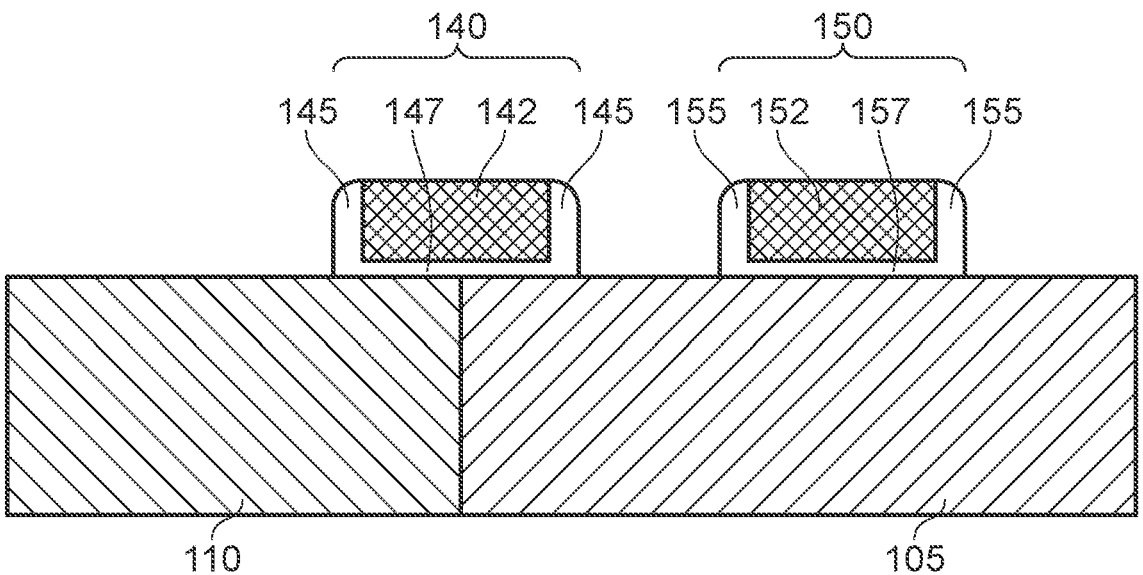

FIG. 5c shows a later stage of the process, subsequent to partial formation of the gate structure 140 and a dummy gate structure 150. At this stage of the process a dielectric material gate oxide stack 147 is formed, on the substrate, at the junction between the end well. In addition a dummy dielectric material gate oxide stack 157 is concurrently formed above part of the n-well, in a region which is to become the drain extension. The dielectric material gate dummy gate oxide stack is the same as the gate oxide stack, and may comprises a composite of layers such as "ONO", that is to say oxide-nitride-oxide, or SiON, or high-K material such as hafnium silicate, to provide suitable insulating properties and dielectric properties.

A polysilicon—or other conductive material—gate 142 is formed above the dielectric material gate oxide stack 147, and a corresponding dummy gate 152 is formed above the dielectric material dummy gate oxide stack 157. Thin spacers 145 and 155 are formed at the edges of the gate and dummy gate respectively. The thin spacers may be oxide, nitride or a combination of the two (SiON), or even a material containing C (SiCON), as the skilled person will appreciate.

Figure 5D:
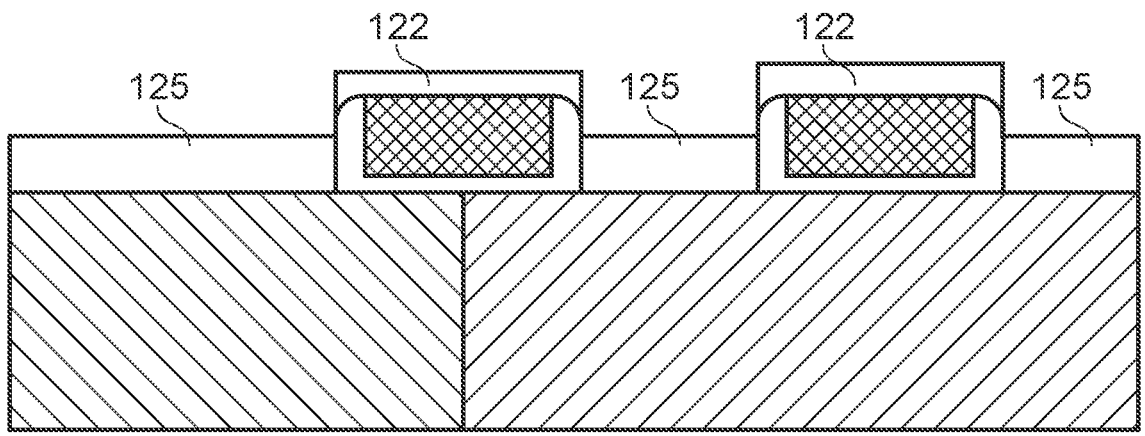

At FIG. 5d is shown a later stage of the process, subsequent to the formation of an epitaxial layer 125 on the silicon material forming the n-well and p-well, whilst the (typically polysilicon) tops of the gate and dummy gate are protected by means of hard masks 122. This epitaxial layer forms the source-drain epitaxy, also referred to as S/D epi. As discussed above, the epitaxially-grown silicon is typically intrinsic or undoped, in that a dopant is not provided in the gaseous epitaxial precursors, although in other embodiments the layer is grown with an in-situ doping, as mentioned above. The epitaxy occurs only on the underlying silicon, that is to say, there is no growth on the gate and gate structure, due to the hard masks. Since the drain extension region of the n-well between the gate and gate extension is not masked, there is epitaxial growth on that region.

Figure 5E:
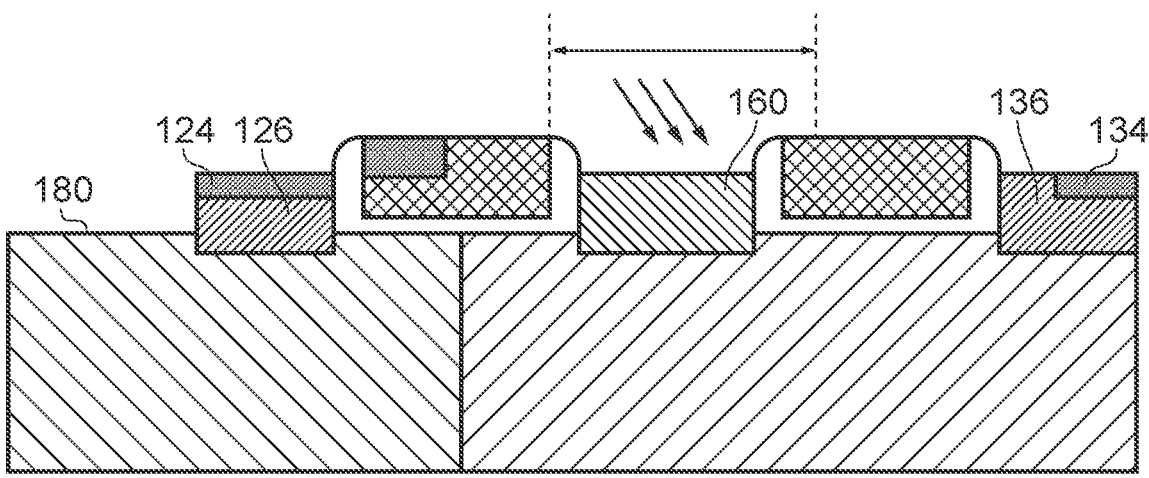

FIG. 5e shows a later stage of processing of the device. A region of the epitaxial layer near or adjacent to the source and on the side of the source remote from the gate has been etched to expose the body 180 and to facilitate contact to the device body. A selective angled n-type dopant implant has been applied to both the source and drain to provide the n-type LDD. Similarly, a selective angled p-type dopant implant has been applied to the epitaxial region in the drain extension between the gate structure and dummy gate structure. Furthermore, in this embodiment a high dose but low-energy implant has been applied to the source and drain regions to provide the relatively highly doped n+ regions 124 and 134 for the source and drain respectively.

Figure 5F:
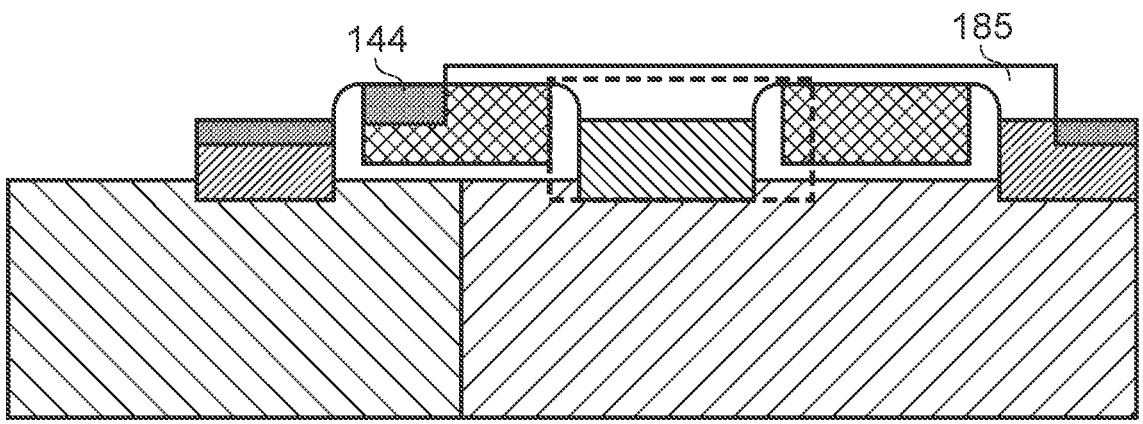

FIG. 5f shows a later stage of the processing of the device. A protective dielectric layer 185 has been deposited over the gate, drain extension, and dummy gate, and partially etched to expose part of the gate, source, drain and body. The source, drain and gate are provided with silicided contact regions, as shown for the source at 124, and drain at 134; that for the gate is shown at 144

The further processing steps required in order to complete the manufacture of the device, in particular the so-called back end of the line (BEOL) processing with the various interconnect levels and dielectrics, are conventional and will be familiar to the skilled person. In consequence they are omitted in order to avoid obfuscating the present disclosure.

Figure 6A:
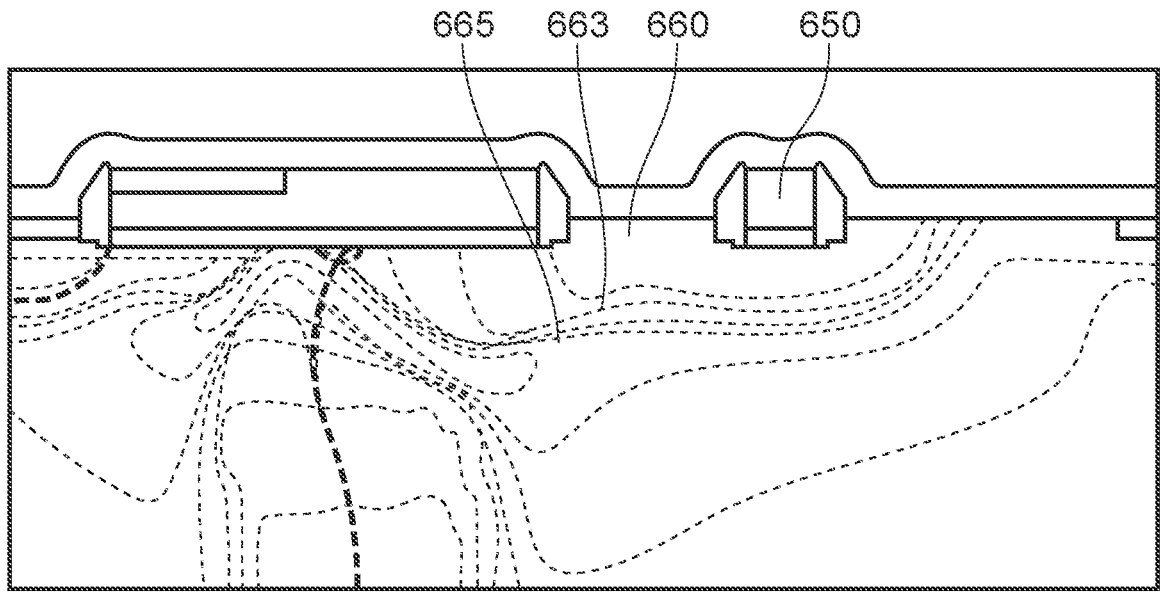
FIG. 6*a* shows simulated current distribution in the on-state for a reference LDMOS device.
Figure 6B:
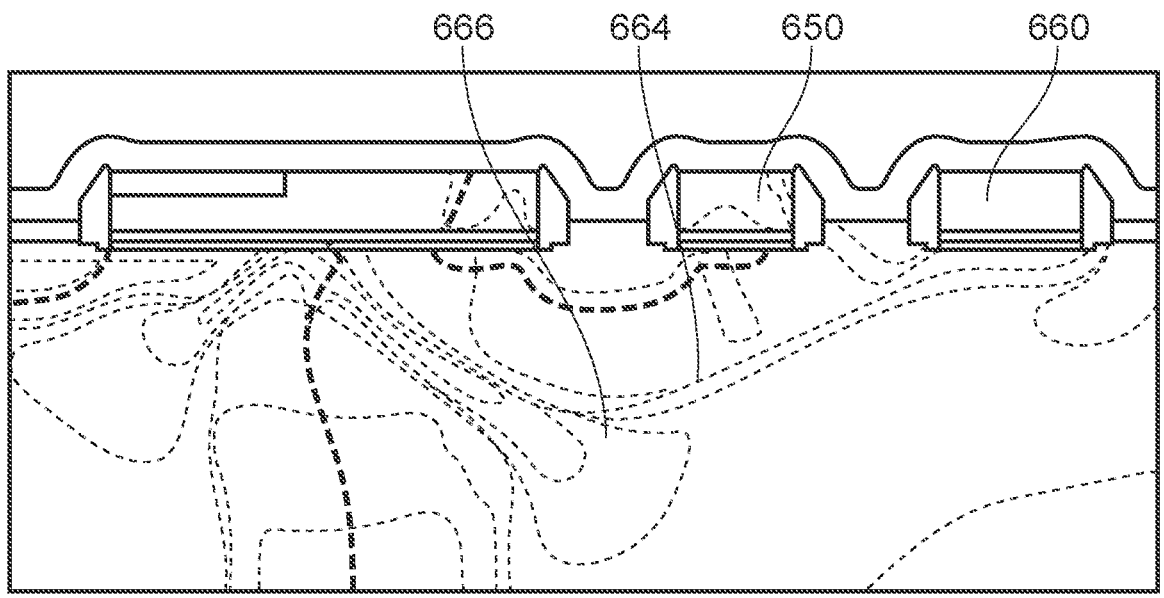
FIG. 6*b* shows simulated current distribution in the on-state for a LDMOS device according to one or more embodiments.

FIG. 6a shows simulated current distribution in the on-state for a reference LDMOS device, and FIG. 6b shows simulated current distribution in the on-state for a LDMOS device according to one or more embodiments. In both instances, a dummy gate 650 has been provided in the drain extension, and in the case of the non-limiting embodiment illustrated in FIG. 6b, a further dummy gate 660 is also included; In FIG. 6b the S/D epi, that is to say, the epitaxial region between the gate structure and dummy gate structure, has been doped in the LDD process as described above. It is apparent (from the current concentration contours shown as dashed lines) that in the reference device, the lateral current flowing from the drain through the drain extension extends into the raised S/D 660 layer in the drain extension, which (in a combination with the high E-fields at the edge of the gate), reduces significantly the robustness of the device. In contrast, it can be seen in FIG. 6b, that in devices according to embodiments, the carrier contours (shown at, 664, 666) extend significantly further below the drain-extension S/D epi, relative to those corresponding contours (663,665) in the reference device, illustrating that the current from the drain to the drain extension has been pushed into the n-well, and does not go through the epi layer. This then reduces or eliminates the problems of high E-field at the edge of the gate and/or high gate leakage. Moreover, it reduces the number of hot carriers near the gate edge.

Figure 7:
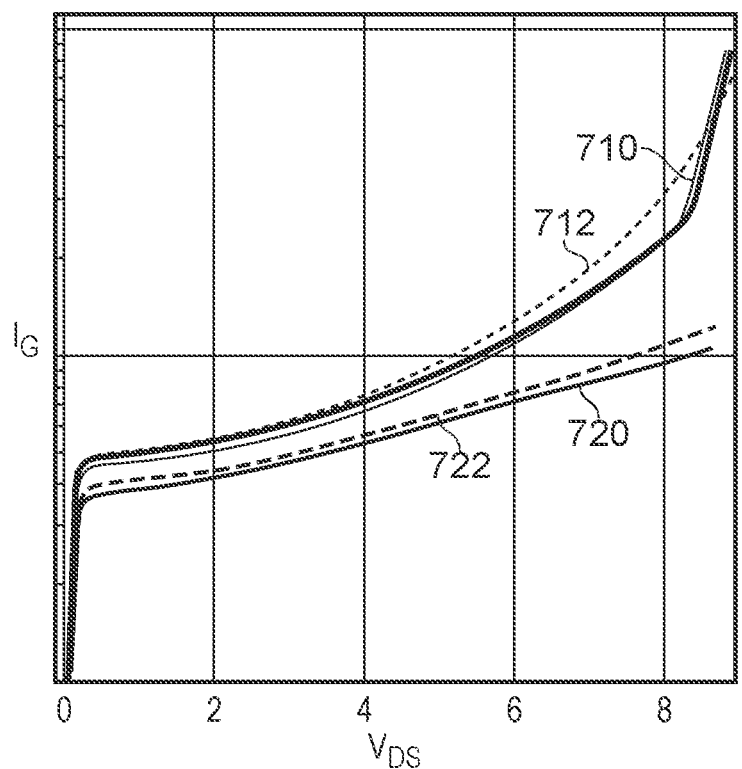
FIG. 7 illustrates on state breakdown voltages for devices according to one or more embodiments relative to a reference device.

FIG. 7 shows simulated results for the on-state breakdown of reference devices and devices according to one or more embodiments of the present disclosure. The figure plots simulations of the gate current $I_G$ against the voltage $V_{DS}$ for the devices operating at a gate voltage of approximately 0.9 V, on a logarithmic scale, for a reference device responding to FIG. 1, at 710 and 712, and for a device according to one or more embodiments, as depicted in FIG. 4, at 720 and 722. The reduced gate current at voltages between 7 and 8V is nearly one half of an order of magnitude relative to the reference device, which demonstrates a very significant improvement.

Figure 8:
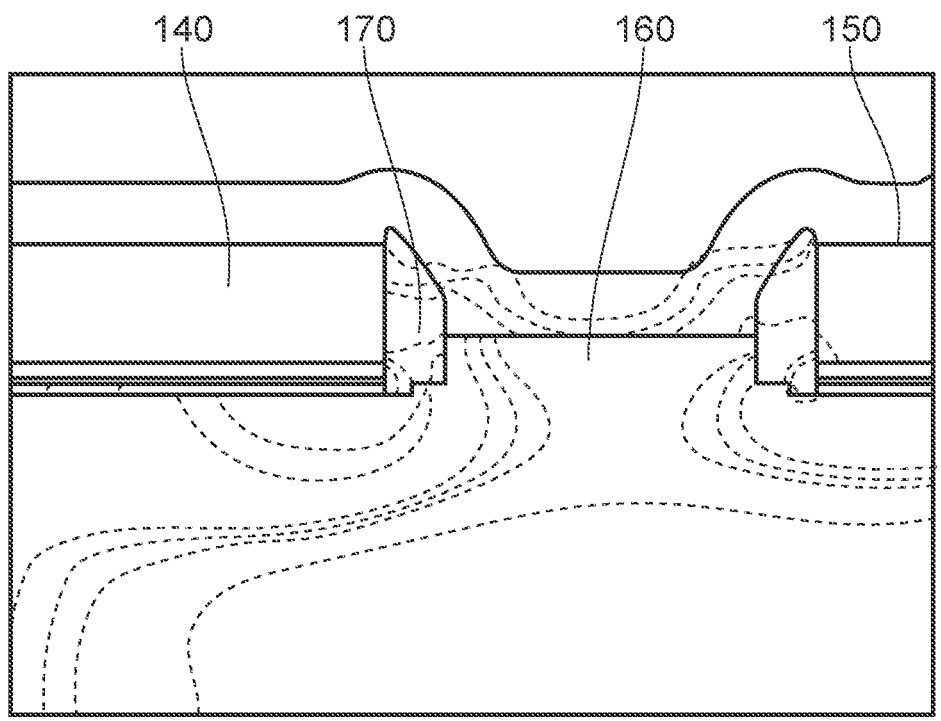
FIG. 8 shows simulated electric field around the gate edge of a reference LDMOS device.

FIG. 8 shows simulated electric field around the gate edge of a reference device. Whereas FIG. 6a shows the current distribution, this figure shows the field distribution in the device, especially focusing on the region close to the edge 170 of the gate 140.

Figure 9:
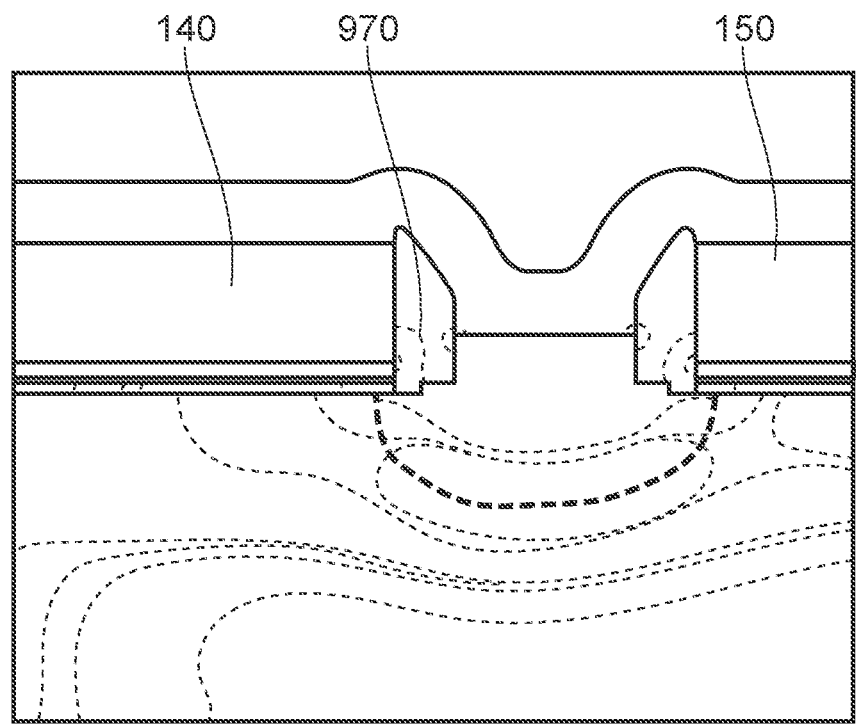
FIG. 9 shows simulated electric field around the gate edge of a LDMOS device according to one or more embodiments.

FIG. 9 shows simulated electric field around the gate edge of a LDMOS device according to one or more embodiments. This figure shows in more detail that the field extends down into the n-well, and there is a lower E-field close to the edge 970 of the gate 140.

Figure 10:
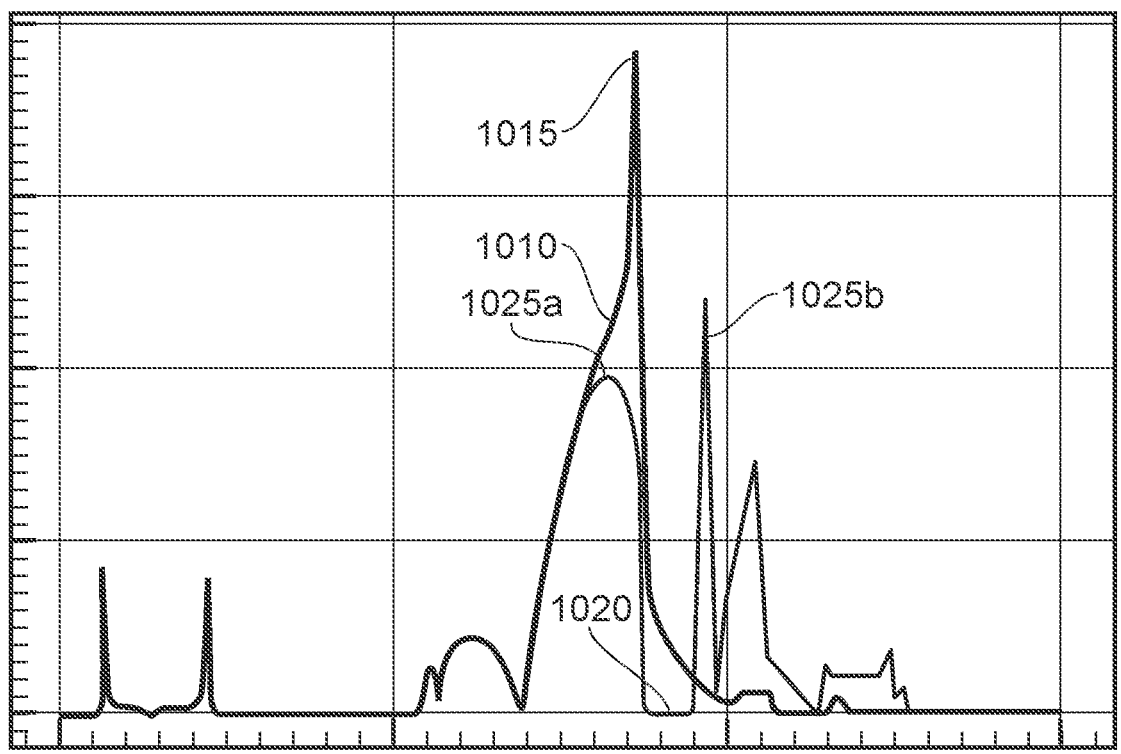
FIG. 10 shows the E-field strength at the gate edge for both a reference device and a device according to one or more embodiments.

FIG. 10 shows the E-field strength at the gate edge for both a reference device and devices according to one or more embodiments. E-field is plotted on the vertical axis or ordinate, in a logarithmic scale (the gridlines marking decades or orders of magnitude) against position on the x-axis or abscissa. For the reference device (without a moderately doped LDD layer in the gap between gate and dummy gate) the peak 1015 in the plot 1010 is between one and two orders of magnitude higher than the maximum peaks 1025a, 1025b, in the devices according to one or more embodiments.

The skilled person will appreciate that the term "channel" as used herein, is defined broadly, to refer to the separation region disposed laterally between the raised source region and the raised drain region. Thus it refers to the full extent of the current path between the drain and source, rather than to a specific region underneath the gate.

From reading the present disclosure, other variations and modifications will be apparent to the skilled person. Such variations and modifications may involve equivalent and other features which are already known in the art of lateral devices, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A semiconductor device comprising:
   a substrate structure;
   a raised source region disposed above the substrate structure;
   a raised drain region disposed above the substrate structure and spaced apart from the raised source region;
   the raised source region and the raised drain region each comprising a relatively heavily doped layer of the first conductivity type, over a relatively lightly doped layer of the first conductivity type, the relatively lightly doped layer extending into the substrate structure;
   a separation region disposed laterally between the raised source region and the raised drain region;
   a gate structure, disposed between the raised source region and the raised drain region and above a part of the separation region, the gate structure being spaced apart from the drain region and defining a drain extension region therebetween;
   a dummy gate structure in the drain extension region and spaced apart from the gate structure; and
   an epitaxial layer, disposed above and in contact with the substrate structure and forming the raised source region, the raised drain region, and a raised region between the gate structure and the dummy gate structure,
   wherein the raised region between the gate structure and the dummy gate structure is relatively lightly doped to a conductivity of a second conductivity type which is opposite the first conductivity type.

2. A semiconductor device as claimed in claim 1, wherein a region of the substrate structure which extends from under the raised drain region to under a part of the gate structure is doped with the first conductivity type, to a level which is lower than the relatively lightly doped level, and a region of the substrate structure which extends from under the remainder of the gate structure to under the raised source region is doped with the second conductivity type, to a level which is lower than the lightly doped level.

3. A semiconductor device as claimed in claim 1, wherein the doping of the lightly doped raised region between the gate structure and the dummy gate structure extends beneath the epitaxial layer into the substrate structure, and extends laterally under a part of at least one of the gate structure and the dummy gate structure.

4. A semiconductor device as claimed in claim 1, wherein the gate structure comprises a gate of a conductive material having a first side face facing the raised drain region and a second side face facing the raised source region, a dielectric layer between and in contact with both the polysilicon gate and the substrate structure, and a respective dielectric spacer layer in contact with the first face and the second face, and wherein the dielectric spacer layer in contact with the second face fills the lateral gap between the gate and the raised source region.

5. A semiconductor device as claimed in claim 1, wherein the dummy gate structure in the drain extension region is spaced apart from the gate structure by between 60 and 250 nm.

6. A semiconductor device as claimed in claim 1, further comprising one or more further dummy gate structures in the drain extension region and spaced apart from the dummy gate structure and distal from the gate structure.

7. A semiconductor device as claimed in claim 1, wherein each of the region of the substrate structure which extends from under the raised drain region to under a part of the gate, and the region of the substrate structure which extends from under the remainder of the gate structure to under the raised source region, is doped with the second conductivity type, to a doping level which is in a range of $10^{16}$-$5\times10^{17}$ cm$^{-3}$.

8. A semiconductor device as claimed in claim 1, wherein the doping level of the raised region between the gate structure and the dummy gate structure is in a range of $10^{17}$-$10^{18}$ cm$^{-3}$.

9. A semiconductor device as claimed in claim 1, wherein the substrate structure comprises a substrate material, a buried oxide layer over the substrate material, and an epitaxial layer over the buried oxide layer.

10. A semiconductor device as claimed in claim 1, being an NMOS device wherein the first conductivity type is n-type and the second conductivity type is p-type.

11. An integrated circuit comprising the semiconductor device as claimed in claim 10, and further comprising a second semiconductor device comprising:
    a substrate structure;
    a raised source region disposed above the substrate structure of the second semiconductor device;
    a raised drain region disposed above the substrate structure of the second semiconductor device and spaced apart from the raised source region of the second semiconductor device;
    the raised source region of the second semiconductor device and the raised drain region of the second semiconductor device each comprising a relatively heavily doped layer of a third conductivity type, over a relatively lightly doped layer of the third conductivity type, the relatively lightly doped layer of the second semiconductor device extending into the substrate structure of the second semiconductor device;
a separation region disposed laterally between the raised source region of the second semiconductor device and the raised drain region of the second semiconductor device;
a gate structure, disposed between the raised source region of the second semiconductor device and the raised drain region of the second semiconductor device and above a part of the separation region of the second semiconductor device, the gate structure of the second semiconductor device being spaced apart from the drain region of the second semiconductor device and defining a drain extension region therebetween;
a dummy gate structure in the drain extension region of the second semiconductor device and spaced apart from the gate structure of the second semiconductor device; and
an epitaxial layer, disposed above and in contact with the substrate structure of the second semiconductor device and forming the raised source region of the second semiconductor device, the raised drain region of the second semiconductor device, and a raised region between the gate structure of the second semiconductor device and the dummy gate structure of the second semiconductor device,
wherein the raised region of the second semiconductor device between the gate structure of the second semiconductor device and the dummy gate structure of the second semiconductor device is relatively lightly doped to a conductivity of a fourth conductivity type which is opposite the third conductivity type, and
wherein the second semiconductor device is a PMOS device wherein the third conductivity type is p-type and the fourth conductivity type is n-type.

12. An integrated circuit as claimed in claim 11, wherein a doping level of the raised region between the gate structure and the dummy gate structure of the NMOS device is the same as that of the relatively lightly doped drain region of the PMOS device.

13. A method of manufacturing a semiconductor device having a raised source region and a raised drain region and a separation therebetween, the method comprising:
defining a gate structure, disposed between the raised source region and the raised drain region and above a part of the separation region, the gate structure being spaced apart from the drain region and defining a drain extension region therebetween;
defining a dummy gate structure in the drain extension region and spaced apart from the gate structure, at the same time and in the same process steps as defining the gate structure;
epitaxially growing a layer, disposed above and in contact with the substrate structure and forming the raised source region, and the raised drain region;
growing an epitaxial layer, disposed above and in contact with the substrate structure and forming a raised region between the gate structure and the dummy gate structure;
implanting a doping material into the raised drain region and into the raised source region to provide a relatively heavily doped layer of a first conductivity type;
providing the raised drain region and the raised source region with a relatively lightly doped layer of the first conductivity type;
and providing the raised region between the gate structure and the dummy gate structure with a relatively lightly doped layer of a second conductivity type which is opposite to the first conductivity type.

14. A method as claimed in claim 13,
wherein the epitaxially-grown layer is not intentionally doped;
wherein the step of providing the raised drain region and the raised source region with a relatively lightly doped layer of the first conductivity type comprises implanting, by means of an angled implant, a doping material into the raised drain region and into the raised source region to provide a relatively lightly doped layer of the first conductivity type; and
wherein the step of providing the raised region between the gate structure and the dummy gate structure with a relatively lightly doped layer of a second conductivity type comprises implanting, by means of an angled implant, a doping material into the raised region between the gate structure and the dummy gate structure to provide a relatively lightly doped layer of a second conductivity type which is opposite to the first conductivity type.

15. A method as claimed in claim 14, wherein the semiconductor device is an LDNMOS device, wherein the method further comprises manufacturing an LDPMOS device concurrently with the LDNMOS device, and wherein the step of implanting a doping material into the raised region between the gate structure and the dummy gate structure of the LDNMOS device is concurrent with implanting a doping material into the raised source and raised drain regions of the LDPMOS device, and the step of implanting a doping material into the raised region between the gate structure and the dummy gate structure of the LDNMOS device is concurrent with implanting a doping material into the raised source and raised drain regions of the LDPMOS device.

* * * * *